US009467094B2

(12) United States Patent
Price et al.

(10) Patent No.: US 9,467,094 B2
(45) Date of Patent: Oct. 11, 2016

(54) PHASE-DEPENDENT OPERATIONAL AMPLIFIERS EMPLOYING PHASE-BASED FREQUENCY COMPENSATION, AND RELATED SYSTEMS AND METHODS

(71) Applicant: QUALCOMM Incorporated, San Diego, CA (US)

(72) Inventors: Burt Lee Price, Apex, NC (US); Dhaval Rajeshbhai Shah, Raleigh, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 343 days.

(21) Appl. No.: 14/317,507

(22) Filed: Jun. 27, 2014

(65) Prior Publication Data
US 2015/0381113 A1 Dec. 31, 2015

(51) Int. Cl.
*H03F 1/02* (2006.01)
*G01R 19/00* (2006.01)
*H03F 3/45* (2006.01)

(52) U.S. Cl.
CPC ......... *H03F 1/0205* (2013.01); *G01R 19/0092* (2013.01); *H03F 3/45076* (2013.01); *H03F 3/45977* (2013.01); *H03F 2200/462* (2013.01); *H03F 2203/45264* (2013.01); *H03F 2203/45588* (2013.01)

(58) Field of Classification Search
CPC .. H03F 1/04; H03F 3/45076; H03F 3/45977; H03F 2200/462; H03F 2203/45588; G01R 19/0092
See application file for complete search history.

(56) References Cited

U.S. PATENT DOCUMENTS

| 7,719,351 B2 | 5/2010 | Pertijs et al. |
| 7,852,158 B2 | 12/2010 | Kobayashi et al. |
| 8,044,718 B2 | 10/2011 | Nicollini et al. |

(Continued)

FOREIGN PATENT DOCUMENTS

| JP | 2004120564 A | 4/2004 |
| WO | 2013095432 A1 | 6/2013 |

OTHER PUBLICATIONS

International Search Report and Written Opinion for PCT/US2015/034685, mailed Sep. 15, 2015, 8 pages.

*Primary Examiner* — Jermele M Hollington
*Assistant Examiner* — Robert P Alejnikov, Jr.
(74) *Attorney, Agent, or Firm* — Withrow & Terranova, PLLC

(57) ABSTRACT

Phase-dependent operational amplifiers ("op-amps") employing phase-based frequency compensation, and related systems and methods are disclosed. A phase-dependent op-amp is provided configured to provide output voltage based on inputs switched by clock signal. The op-amp employs a frequency compensation system having multiple frequency compensation circuits. The frequency compensation circuit corresponding to the clock phase is selected by selection circuit and coupled to the voltage output node. The op-amp charges each frequency compensation circuit during the clock phase to store voltage approximately equal to output voltage. When transitioning to a clock phase, output voltage of op-amp does not have to charge frequency compensation circuit. Voltage of frequency compensation circuit stored during clock phase is approximately equal to output voltage of op-amp for clock phase. The op-amp need only provide a small amount of voltage to the frequency compensation circuit to slew it to its designed voltage during instances of its clock phase.

29 Claims, 12 Drawing Sheets

(56) References Cited

U.S. PATENT DOCUMENTS

| | | |
|---|---|---|
| 2006/0055456 A1 | 3/2006 | Niederkorn |
| 2006/0176108 A1 | 8/2006 | Huijsing et al. |
| 2008/0018392 A1* | 1/2008 | Nolan ................ H03F 3/45986 330/9 |
| 2010/0039179 A1* | 2/2010 | Chung ................ H03F 3/45219 330/257 |
| 2013/0147559 A1 | 6/2013 | Schaffer |
| 2015/0222417 A1* | 8/2015 | Song .................... H03F 3/45475 375/355 |

* cited by examiner

PHASE-DEPENDENT OPERATIONAL AMPLIFIERS EMPLOYING PHASE-BASED FREQUENCY COMPENSATION, AND RELATED SYSTEMS AND METHODS

BACKGROUND

I. Field of the Disclosure

The technology of the disclosure relates generally to operational amplifiers, and particularly to slew rate variation in an operational amplifier output caused by frequency compensation.

II. Background

An operational amplifier (also referred to as an "op-amp") is a device that receives differential input signals and generates an output voltage based on a gain of the op-amp. A wide variety of circuit functions may be accomplished using op-amps. Thus, a vast array of electronic devices employ op-amps in their circuits. However, manufacturing process variations in an op-amp's internal components may generate an unintended internal offset voltage that affects the output voltage in an undesirable manner. The output voltage of an op-amp is calculated by multiplying an op-amp's gain by a sum of the voltage difference of the differential input signals and any such offset voltage present. For example, an op-amp receiving a first differential input $V_1$ and a second differential input $V_2$, and having an offset voltage $V_{OFFSET}$, generates an output voltage $V_{OUT}$ equal to A $(V_1-V_2+V_{OFFSET})$, where 'A' represents the op-amp's gain. One way to reduce the effects of an op-amp's offset voltage is to use an auto-zeroing operational amplifier (also referred to as an "auto-zeroing op-amp"). An auto-zeroing op-amp includes circuitry that attenuates the effects that any offset voltage of the op-amp has on the output voltage $V_{OUT}$.

In this regard, FIG. 1 illustrates an exemplary auto-zeroing op-amp 10. In this example, the auto-zeroing op-amp 10 includes a first differential input 12, a second differential input 14, a main op-amp 16, and a nulling op-amp 18. The main op-amp 16 provides the primary signal amplification for the auto-zeroing op-amp 10, while the nulling op-amp 18 reduces the effects of the main op-amp's 16 offset voltages. The main op-amp 16 generates an output voltage $V_{OUT}$ on a main voltage output node 20 based on an amplified sum of a differential of first main differential inputs 22(1), 22(2) and an associated offset voltage. To reduce the effects of the offset voltage of the main op-amp 16 being applied to the output voltage $V_{OUT}$, the main op-amp 16 includes second main differential inputs 24(1), 24(2). A clock signal CLK activates and deactivates switches 26(1)-26(4) that control input voltages received by the nulling op-amp 18, as well as a correction voltage received on the second main differential input 24(1) of the main op-amp 16. In this regard, the switches 26(1)-26(4) are employed to change the input voltages to the nulling op-amp 18 and the main op-amp 16 in a way that causes the output voltage of the nulling op-amp 18 to attenuate the offset voltages of the main op-amp 16.

More specifically, during a first phase of the clock signal CLK, switches 26(1), 26(2) are closed and switches 26(3), 26(4) are opened. Closing switch 26(1) causes both first nulling differential inputs 28(1), 28(2) of the nulling op-amp 18 to each receive the same input voltage. Closing switch 26(2) causes an output voltage known as $V_{OUT-NULL-P1}$ to be generated on a nulling voltage output node 30 of the nulling op-amp 18, which is provided to a second nulling differential input 32(2). A reference voltage $V_{AZREF}$ is provided to a second nulling differential input 32(1). Providing voltage $V_{OUT-NULL-P1}$ to the second nulling differential input 32(2) of the nulling op-amp 18 attenuates the effects of the nulling op-amp's 18 offset voltage during the first phase of the clock signal CLK. Voltage $V_{OUT-NULL-P1}$ is also provided to a capacitor 34(1), which stores $V_{OUT-NULL-P1}$ as a nulling correction voltage. In this manner, the capacitor 34(1) will provide voltage $V_{OUT-NULL-P1}$ to the second nulling differential input 32(2) to attenuate the effects of the nulling op-amp 18 during the second phase of the clock signal CLK.

During a second phase of the clock signal CLK, switches 26(3), 26(4) are closed, and switches 26(1), 26(2) are opened. Closing switch 26(3) causes the nulling op-amp 18 to receive input voltages from the first differential input 12 and the second differential input 14. Closing switch 26(4) results in a voltage $V_{OUT-NULL-P2}$ being generated on the nulling voltage output node 30, thereby causing the nulling op-amp's 18 output voltage to change from $V_{OUT-NULL-P1}$ to $V_{OUT-NULL-P2}$. Voltage $V_{OUT-NULL-P2}$ is provided to the second main differential input 24(1) of the main op-amp 16, which attenuates the effects of the main op-amp's 16 offset voltage during the second phase of the clock signal CLK. Voltage $V_{OUT-NULL-P2}$ is also provided to a capacitor 34(2), which stores $V_{OUT-NULL-P2}$ as a main correction voltage. The reference voltage $V_{AZREF}$ is provided to a second main differential input 24(1). In this manner, the capacitor 34(2) provides voltage $V_{OUT-NULL-P2}$ to the second main differential input 24(1) to attenuate the effects of the offset voltage of the main op-amp 16 during the first phase of the clock signal CLK.

While the auto-zeroing op-amp 10 in FIG. 1 may reduce the effects of the main op-amp's 16 offset voltages on the output voltage $V_{OUT}$, this design can lead to other issues. In particular, the nulling op-amp 18 in FIG. 1 employs an internal frequency compensation circuit to achieve loop stability with respect to its output voltage. To stabilize the output voltage $V_{OUT}$, the frequency compensation circuit is coupled to the nulling voltage output node 30. The frequency compensation circuit stores a voltage associated with the output voltage of the nulling op-amp 18 to compensate for stability issues of the nulling op-amp 18. However, as previously described, when the input voltages to the nulling op-amp 18 change between the first and second phases of the clock signal CLK, the nulling op-amp 18's output voltage changes (i.e., slews) from $V_{OUT-NULL-P1}$ to $V_{OUT-NULL-P2}$ over a period of time. The change in the nulling op-amp's 18 output voltage from $V_{OUT-NULL-P1}$ to $V_{OUT-NULL-P2}$ causes the voltage stored in the frequency compensation circuit to change from a voltage associated with the first phase of the clock signal CLK to a voltage associated with the second phase of the clock signal CLK. Because the frequency compensation circuit is coupled to the nulling voltage output node 30, the output voltage generated by the nulling op-amp 18 is used to slew the nulling op-amp's 18 output voltage from $V_{OUT-NULL-P1}$ to $V_{OUT-NULL-P2}$. Large slew times of the nulling op-amp 18's output voltage causes erroneous voltage levels to appear in the output voltage of the main op-amp 16 when the clock signal CLK transitions phases. Therefore, it would be advantageous to provide op-amps that include frequency compensation, whether for auto-zeroing op-amps or other applications, without incurring a relatively large slew time of an op-amp's output voltage.

SUMMARY OF THE DISCLOSURE

Aspects disclosed in the detailed description include phase-dependent operational amplifiers (also referred to as "op-amps") employing phase-based frequency compensation. Related systems and methods are also disclosed. In one aspect, a phase-dependent op-amp is provided that is configured to provide an output voltage at a configured gain based on differential inputs switched based on a clock phase of a clock signal. The phase-dependent op-amp employs a phase-based frequency compensation system having multiple frequency compensation circuits coupled to a voltage output node of the phase-dependent op-amp. Each frequency compensation circuit corresponds to a different clock phase of the clock signal. During operation, the frequency compensation circuit of the frequency compensation system corresponding to the current clock phase is selected by a selection circuit and coupled to the voltage output node of the phase-dependent op-amp for frequency compensation. In addition, the phase-dependent op-amp also charges the selected frequency compensation circuit during its corresponding clock phase to store a voltage approximately equal to the output voltage of the phase-dependent op-amp during that clock phase. In this manner, when transitioning again back to a given clock phase of the clock signal, the corresponding frequency compensation circuit provides the stored output voltage to the voltage output node of the phase-dependent op-amp. Because the frequency compensation circuit already has a stored voltage approximately equal to the desired output voltage for the transitioned to phase, the phase-dependent op-amp may need to only provide a small amount of voltage (e.g., a voltage equal to the difference between the desired output voltage and the currently stored voltage) to the corresponding frequency compensation circuit to slew it back to its desired voltage during subsequent instances of its corresponding clock phase. Because only a small amount of voltage is needed to charge the corresponding frequency compensation circuit, the phase-dependent op-amp can slew more quickly to the output voltage corresponding to a given clock phase of the clock signal.

In this regard in one aspect, a phase-dependent op-amp is provided. The phase-dependent op-amp comprises a differential amplifier. The differential amplifier comprises a first differential pair of inputs switched in response to a clock signal, the differential amplifier configured to generate an output voltage on a voltage output node based on a differential of the first differential pair of inputs. The phase-dependent op-amp further comprises a phase-based frequency compensation system coupled to the voltage output node. The phase-based frequency compensation system comprises a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the output voltage. The phase-based frequency compensation system further comprises a selection circuit configured to select a frequency compensation circuit among the plurality of frequency compensation circuits based on the corresponding clock phase of the clock signal. In this manner, the slew rate of the phase-dependent op-amp is increased for each phase of the clock signal, while still providing frequency compensation.

In another aspect, a phase-dependent operational amplification means is provided. The phase-dependent operational amplification means comprises a means for generating an output voltage based on a differential of a first differential pair of inputs. The phase-dependent operational amplification means further comprises a means for phase-based frequency compensating the output voltage. The means for phase-based frequency compensating the output voltage comprises a plurality of frequency compensation means for compensating the output voltage, each corresponding to a different corresponding clock phase of a clock signal, each frequency compensation means among the plurality of frequency compensation means configured to store a phase-specific compensation voltage corresponding to the corresponding clock phase of the clock signal to increase a slew rate of the output voltage. The means for phase-based frequency compensating the output voltage further comprises a means for selecting one of the plurality of frequency compensation means of compensating the output voltage based on the corresponding clock phase of the clock signal.

In another aspect, a phase-dependent auto-zeroing op-amp is provided. The phase-dependent auto-zeroing op-amp comprises a main op-amp. The main op-amp comprises a first main differential pair of inputs configured to receive a first voltage and a second voltage. The main op-amp further comprises a second main differential pair of inputs configured to: receive a reference voltage and a main correction voltage during a first clock phase of a clock signal, and receive a reference voltage and a nulling output voltage generated on a nulling voltage output node during a second clock phase of the clock signal. The main op-amp is configured to generate an output voltage on a main voltage output node based on a differential of the first main differential pair of inputs and a differential of the second main differential pair of inputs. The phase-dependent auto-zeroing op-amp further comprises a phase-dependent nulling op-amp. The phase-dependent nulling op-amp comprises a differential amplifier. The differential amplifier comprises a first nulling differential pair of inputs configured to: receive the first voltage during the first clock phase of the clock signal, and receive the first voltage and the second voltage during the second clock phase of the clock signal. The differential amplifier further comprises a second nulling differential pair of inputs configured to: receive the reference voltage and the nulling output voltage generated on the nulling voltage output node during the first clock phase of the clock signal, and receive the reference voltage and a nulling correction voltage during the second clock phase of the clock signal. The differential amplifier is configured to generate an output voltage based on a differential of the first nulling differential pair of inputs and a differential of the second nulling differential pair of inputs. The phase-dependent nulling operational amplifier is configured to generate the nulling output voltage on the nulling voltage output node based on the output voltage of the differential amplifier. The phase-dependent nulling op-amp further comprises a phase-based frequency compensation system coupled to the nulling voltage output node of the phase-dependent nulling op-amp. The phase-based frequency compensation system comprises a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the nulling output voltage on the nulling voltage output node. The phase-based frequency compensation system further comprises a selection circuit configured to select a frequency compensation circuit among the plurality of frequency compensation circuits based on the corresponding clock phase of the clock signal.

In another aspect, an on-die current measurement system is provided. The on-die current measurement system comprises a voltage source configured to provide voltage to a source of a head switch transistor, and provide voltage to a source of a mirror transistor. The head switch transistor is configured to provide voltage to a load circuit. The mirror transistor is configured to provide voltage to a source of a cascode transistor. A drain of the cascode transistor is configured to provide voltage to a sense resistor. The sense resistor is configured to provide a voltage to an analog-to-digital converter (ADC). The ADC is configured to convert the voltage from the sense resistor into a digital signal representative of a power supply current of the load circuit. The on-die current measurement system further comprises a phase-dependent auto-zeroing op-amp configured to receive a first voltage from a drain of the mirror transistor and a second voltage from the load circuit. The phase-dependent auto-zeroing op-amp comprises a main op-amp. The main op-amp comprises a first main differential pair of inputs configured to receive a first voltage and a second voltage. The main op-amp further comprises a second main differential pair of inputs configured to: receive a reference voltage and a main correction voltage during a first clock phase of a clock signal, and receive a reference voltage and a nulling output voltage generated on a nulling voltage output node during a second clock phase of the clock signal. The main op-amp is configured to generate an output voltage on a main voltage output node based on a differential of the first main differential pair of inputs and a differential of the second main differential pair of inputs. The phase-dependent auto-zeroing op-amp further comprises a phase-dependent nulling op-amp. The phase-dependent nulling op-amp comprises a differential amplifier. The differential amplifier comprises a first nulling differential pair of inputs configured to: receive the first voltage during the first clock phase of the clock signal, and receive the first voltage and the second voltage during the second clock phase of the clock signal. The differential amplifier further comprises a second nulling differential pair of inputs configured to: receive the reference voltage and the nulling output voltage generated on the nulling voltage output node during the first clock phase of the clock signal, and receive the reference voltage and a nulling correction voltage during the second clock phase of the clock signal. The differential amplifier is configured to generate an output voltage based on a differential of the first nulling differential pair of inputs and a differential of the second nulling differential pair of inputs. The phase-dependent nulling operational amplifier is configured to generate the nulling output voltage on the nulling voltage output node based on the output voltage of the differential amplifier. The phase-dependent nulling op-amp further comprises a phase-based frequency compensation system coupled to the nulling voltage output node of the phase-dependent nulling op-amp. The phase-based frequency compensation system comprises a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the nulling output voltage on the nulling voltage output node. The phase-based frequency compensation system further comprises a selection circuit configured to select a frequency compensation circuit among the plurality of frequency compensation circuits based on the corresponding clock phase of the clock signal. The phase-dependent auto-zeroing op-amp is further configured to provide the output voltage generated on the main voltage output node to a gate of the cascode transistor.

In another aspect, a method of phase-dependent operational amplification is provided. The method comprises generating an output voltage on a voltage output node based on a differential of a first differential pair of inputs. The method further comprises selecting one of a plurality of frequency compensation circuits based on a clock phase of a clock signal. The method further comprises compensating the output voltage using one of the plurality of frequency compensation circuits, each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the output voltage.

DETAILED DESCRIPTION

Figure 1:
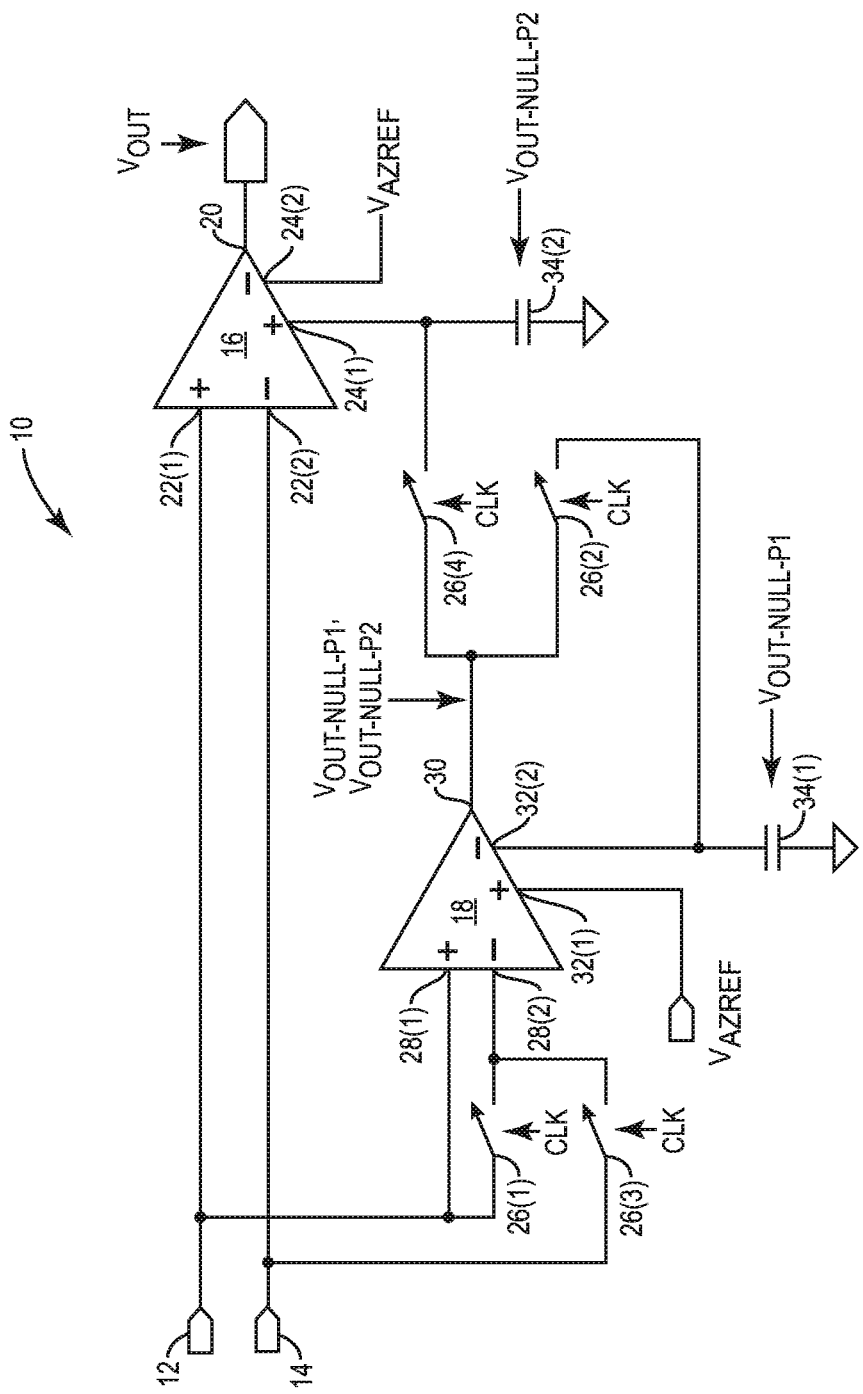
FIG. 1 is a circuit diagram of an exemplary auto-zeroing operational amplifier (op-amp)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include phase-dependent operational amplifiers (also referred to as "op-amps") employing phase-based frequency compensation. Related systems and methods are also disclosed. In one aspect, a phase-dependent op-amp is provided that is configured to provide an output voltage at a configured gain based on differential inputs switched based on a clock phase of a clock signal. The phase-dependent op-amp employs a phase-based frequency compensation system having multiple frequency compensation circuits coupled to a voltage output node of the phase-dependent op-amp. Each frequency compensation circuit corresponds to a different clock phase of the clock signal. During operation, the frequency compensation circuit of the frequency compensation system corresponding to the current clock phase is selected by a selection circuit and coupled to the voltage output node of the phase-dependent op-amp for frequency compensation. In addition, the phase-dependent op-amp also charges the selected frequency compensation circuit during its corresponding clock phase to store a voltage approximately equal to the output voltage of the phase-dependent op-amp during that clock phase. In this manner, when transitioning again back to a given clock phase of the clock signal, the corresponding frequency compensation circuit provides the stored output voltage to the voltage output node of the phase-dependent op-amp. Because the frequency compensation circuit already has a stored voltage approximately equal to the desired output voltage for the transitioned to phase, the phase-dependent op-amp may need to only provide a small amount of voltage (e.g., a voltage equal to the difference between the desired output voltage and the currently stored voltage) to the corresponding frequency compensation circuit to slew it back to its desired voltage during subsequent instances of its corresponding clock phase. Because only a small amount of voltage is needed to charge the corresponding frequency compensation circuit, the phase-dependent op-amp can slew more quickly to the output voltage corresponding to a given clock phase of the clock signal.

Figure 2:
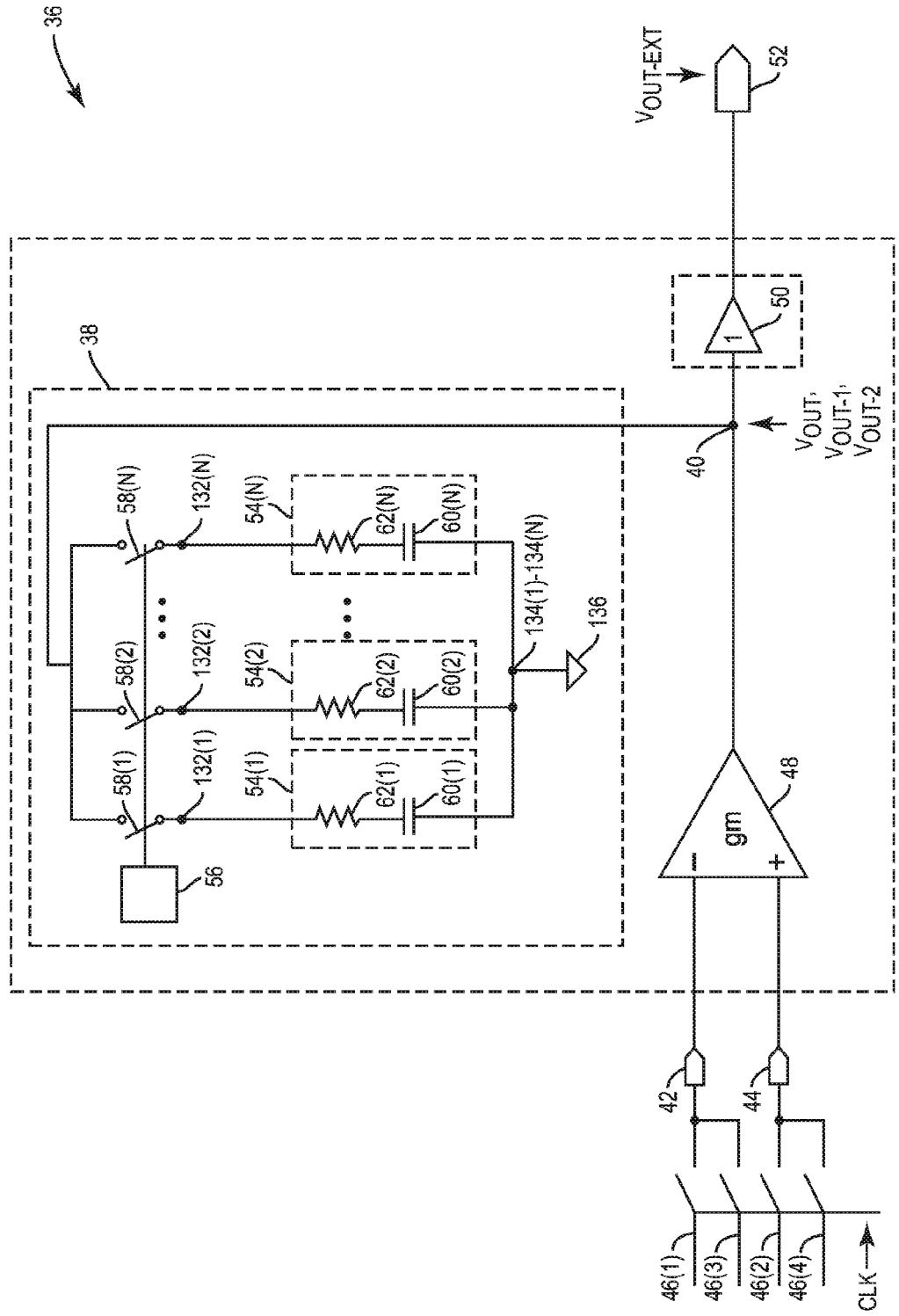
FIG. 2 is a circuit diagram of an exemplary phase-dependent op-amp employing a phase-based frequency compensation system employing a plurality of frequency compensation circuits, and a selection circuit configured to select one of the frequency compensation circuits based on a clock phase of a clock signal to increase a slew rate of an output voltage of the phase-dependent op-amp.

In this regard, FIG. 2 illustrates an exemplary phase-dependent op-amp 36 employing a phase-based frequency compensation system 38. As will be discussed below in more detail, the phase-dependent op-amp 36 is configured to provide an output voltage $V_{OUT}$ on a voltage output node 40 based on a first differential pair of inputs 42, 44 (also referred to as "differential inputs 42, 44") that vary based on switches 46(1)-46(4) controlled by a clock signal CLK. The differential inputs 42, 44 are provided to a differential amplifier 48 (such as a transconductance amplifier, or "gm" amplifier) that generates the output voltage $V_{OUT}$ on the voltage output node 40. In this example, a unity gain amplifier 50 receives the output voltage $V_{OUT}$ and drives an external output voltage $V_{OUT-EXT}$ to an external voltage output node 52. Notably, while this example includes the unity gain amplifier 50, other aspects may provide similar functionality by employing circuit elements in place of the unity gain amplifier 50, such as a wire. The phase-based frequency compensation system 38 employs a plurality of frequency compensation circuits 54(1)-54(N) coupled to the voltage output node 40. Each frequency compensation circuit 54(1)-54(N) corresponds to a different clock phase of the clock signal CLK. The frequency compensation circuit 54(1)-54(N) corresponding to the current clock phase of the clock signal CLK is selected by a selection circuit 56 and coupled to the voltage output node 40. The phase-dependent op-amp 36 charges the selected frequency compensation circuit 54(1)-54(N) during its corresponding clock phase to store a voltage approximately equal to the output voltage $V_{OUT}$ during that clock phase. Thus, when transitioning again back to a given clock phase of the clock signal CLK, the corresponding frequency compensation circuit 54(1)-54(N) provides the stored output voltage to the voltage output node 40 of the phase-dependent op-amp 36. The corresponding frequency compensation circuit 54(1)-54(N) only requires a small amount of voltage from the phase-dependent op-amp 36 during subsequent instances of its corresponding clock phase to replace charge lost to device parasitics and reach its designed voltage. Thus, the phase-dependent op-amp 36 can slew more quickly to the output voltage $V_{OUT}$ corresponding to a given clock phase of the clock signal CLK while still receiving frequency compensation.

With continuing reference to FIG. 2, the following example describes the operation of the phase-dependent op-amp 36 wherein the frequency compensation circuits 54(1), 54(2) have been previously charged to the output voltage $V_{OUT}$ corresponding to the first clock phase, $V_{OUT-1}$, and the second clock phase, $V_{OUT-2}$, respectively. In this regard, during the first clock phase of the clock signal CLK, switches 46(1), 46(2) are closed while switches 46(3), 46(4) are opened. The differential amplifier 48 is configured to receive input voltages corresponding to the first clock phase of the clock signal CLK from the differential inputs 42, 44, and generate the output voltage $V_{OUT-1}$ on the voltage output node 40. The selection circuit 56 is configured to select the frequency compensation circuit 54(1) corresponding to the first clock phase by activating a corresponding switch 58(1). The frequency compensation circuit 54(1) in this example is comprised of a resistor-capacitor (RC) circuit that includes a capacitor 60(1) in series with a resistor 62(1). In this manner, the frequency compensation circuit 54(1) is configured to have a voltage approximately equal to the output voltage $V_{OUT-1}$ stored on the capacitor 60(1) from a previous instance of the first clock phase. Because the capacitor 60(1) in the frequency compensation circuit 54(1) has a stored voltage approximately equal to the output voltage $V_{OUT-1}$, only a small amount of voltage from the voltage output node 40 is required to slew the voltage stored in the frequency compensation circuit 54(1) to $V_{OUT\text{-}1}$. Thus, voltage from the phase-dependent op-amp 36 is used to slew the output voltage $V_{OUT}$ on the voltage output node 40 to the output voltage $V_{OUT\text{-}1}$.

With continuing reference to FIG. 2, upon transitioning from the first clock phase to the second clock phase of the clock signal CLK, switches 46(3), 46(4) are closed, while switches 46(1), 46(2) are opened. The differential amplifier 48 is configured to receive input voltages corresponding to the second clock phase of the clock signal CLK from the differential inputs 42, 44, and generate the output voltage $V_{OUT\text{-}2}$ on the voltage output node 40. Thus, the output voltage $V_{OUT}$ on the voltage output node 40 must slew from the output voltage $V_{OUT\text{-}1}$ to the output voltage $V_{OUT\text{-}2}$. Similar to the operation described for the first clock phase, the selection circuit 56 is configured to select the frequency compensation circuit 54(2) corresponding to the second clock phase by activating a corresponding switch 58(2). However, the frequency compensation circuit 54(2) is configured to have a voltage approximately equal to the output voltage $V_{OUT\text{-}2}$ stored on the capacitor 60(2) from a previous instance of the second clock phase. The capacitor 60(2) in the frequency compensation circuit 54(2) has a stored voltage approximately equal to the output voltage $V_{OUT\text{-}2}$, meaning that only a small amount of voltage from the voltage output node 40 is required to slew the voltage stored in the frequency compensation circuit 54(2) to $V_{OUT\text{-}2}$. Because only a small amount of voltage is needed to slew the voltage of the frequency compensation circuit 54(2), the output voltage $V_{OUT}$ on the voltage output node 40 will slew from the output voltage $V_{OUT\text{-}1}$ to the output voltage $V_{OUT\text{-}2}$ more quickly as compared to an op-amp not employing the phase-based frequency compensation system 38.

Figure 3:
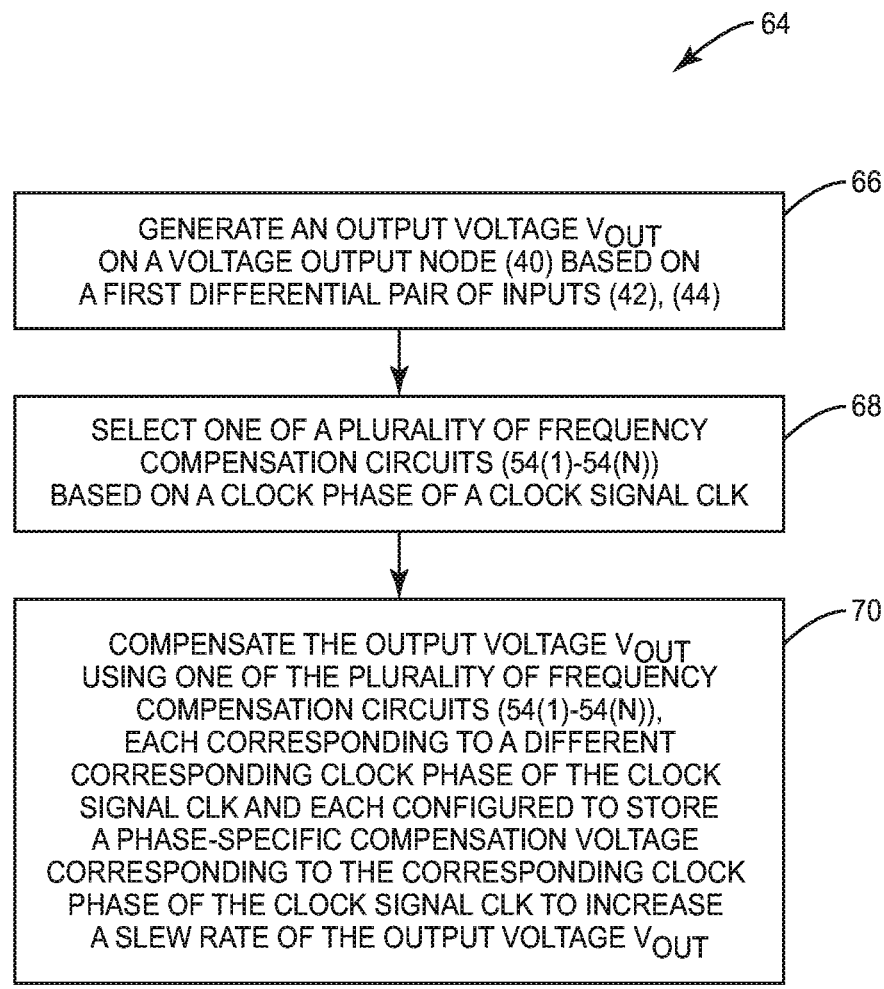
FIG. 3 is a flowchart illustrating an exemplary process of the phase-dependent op-amp in FIG. 2 selecting one of the plurality of frequency compensation circuits based on the clock phase of the clock signal to increase the slew rate of the output voltage of the phase-dependent op-amp.

In this regard, FIG. 3 illustrates an exemplary process 64 employed by the phase-dependent op-amp 36 in FIG. 2 for increasing slew rates of the output voltage $V_{OUT}$ on the voltage output node 40 following transitions of the clock phase. With reference to FIG. 3, the differential amplifier 48 generates the output voltage $V_{OUT}$ based on a differential of the first differential pair of inputs 42, 44 (block 66). Further, the phase-based frequency compensation system 38 provides frequency compensation to the phase-dependent op-amp 36. The phase-based frequency compensation system 38 selects one of the plurality of frequency compensation circuits 54(1)-54(N) based on the clock phase of the clock signal CLK (block 68). The phase-based frequency compensation system 38 compensates the output voltage $V_{OUT}$ using one of the plurality of frequency compensation circuits 54(1)-54(N) that corresponds to the current phase of the clock signal CLK (block 70). As previously described, each frequency compensation circuit 54(1)-54(N) is designed to store a phase-specific compensation voltage corresponding to the clock phase of the clock signal CLK. Designing each frequency compensation circuit 54(1)-54(N) to store a phase-specific voltage allows the phase-dependent op-amp 36 to use its voltage to slew the output voltage $V_{OUT}$ on the voltage output node 40 without needing to provide more than a small amount of voltage to the corresponding frequency compensation circuit 54(1)-54(N) to slew its stored voltage. Because only a small amount of voltage is required to slew the frequency compensation circuit 54(1)-54(N) upon a transition of the clock phase of the clock signal CLK, the output voltage $V_{OUT}$ on the voltage output node 40 slews more quickly following a clock phase transition. Thus, employing the process 64 allows the phase-dependent op-amp 36 to slew the output voltage $V_{OUT}$ on the voltage output node 40 faster upon a clock phase transition as compared to a process that does not use the phase-based frequency compensation system 38. In this manner, achieving frequency compensation in conjunction with increased slew rates makes the phase-dependent op-amp 36 useful in a variety of systems.

Figure 4:
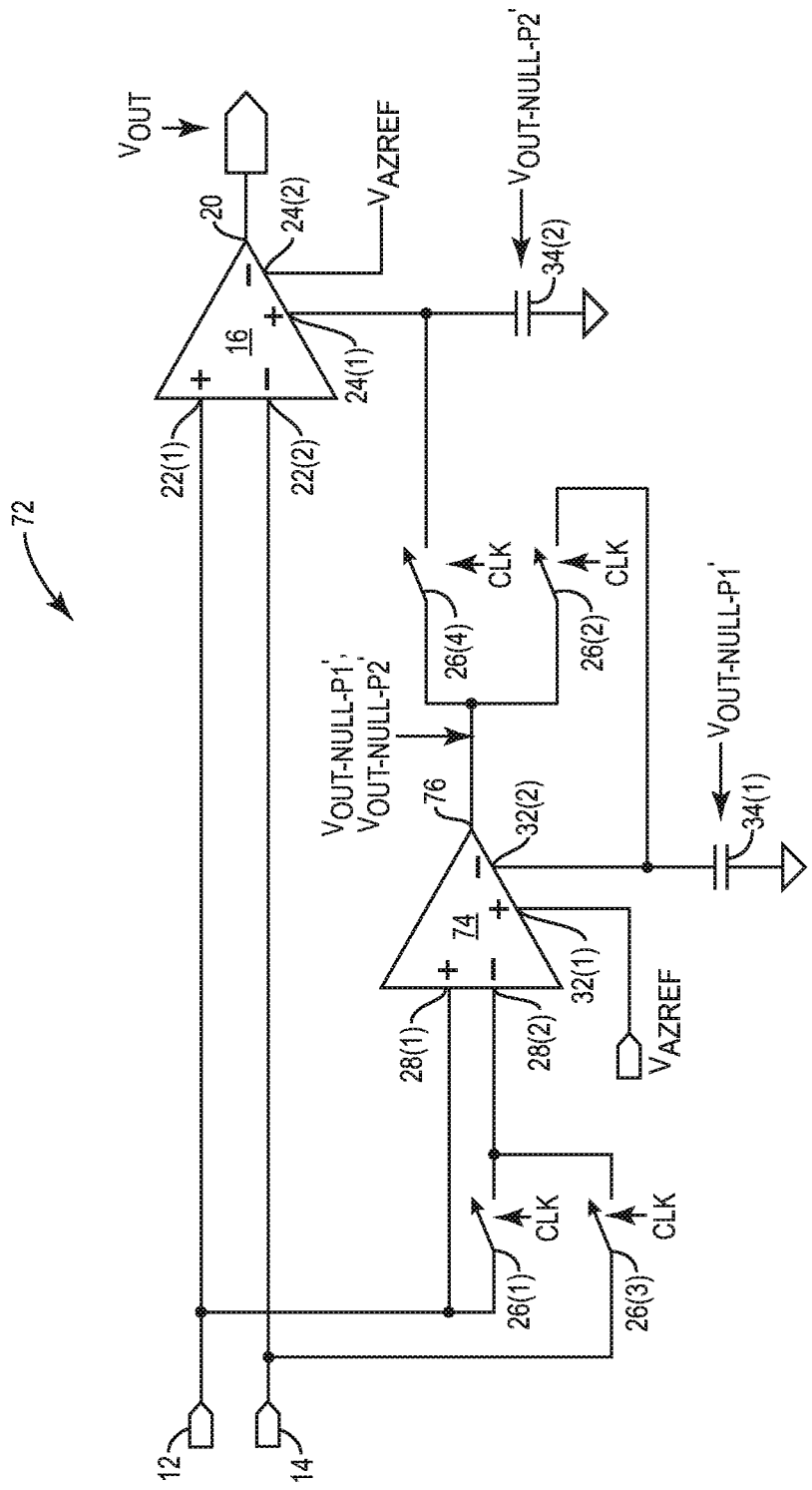
FIG. 4 is a circuit diagram of an exemplary phase-dependent auto-zeroing op-amp that employs a phase-dependent nulling op-amp employing the phase-based frequency compensation system in FIG. 2.

In this regard, FIG. 4 illustrates a phase-dependent auto-zeroing op-amp 72 that includes a phase-dependent nulling op-amp 74 employing the phase-based frequency compensation system 38 in FIG. 2. The phase-dependent auto-zeroing op-amp 72 includes certain common components with the auto-zeroing op-amp 10 in FIG. 1. Such common components are denoted by the same number in FIG. 4 as in FIG. 1, and thus will not be re-described herein. In this manner, during a first clock phase of a clock signal CLK, the phase-dependent nulling op-amp 74 generates a nulling output voltage on a nulling voltage output node 76 specific to the second clock phase, $V_{OUT\text{-}NULL\text{-}P1'}$. Notably, the nulling voltage output node 76 is analogous to the external voltage output node 52 in FIG. 2. Further, similar to the auto-zeroing op-amp 10 in FIG. 1, upon the clock signal CLK transitioning to the second clock phase, the phase-dependent nulling op-amp 74 generates a nulling output voltage on the nulling voltage output node 76 specific to the second clock phase, $V_{OUT\text{-}NULL\text{-}P2'}$. However, because the phase-dependent nulling op-amp 74 employs the phase-based frequency compensation system 38 in FIG. 2, the nulling voltage output node 76 slews from $V_{OUT\text{-}NULL\text{-}P1'}$ to $V_{OUT\text{-}NULL\text{-}P2'}$ more quickly as compared to the auto-zeroing amp 10 in FIG. 1. More specifically, similar to the phase-dependent op-amp 36 in FIG. 2 and the process 64 in FIG. 3, each frequency compensation circuit 54(1)-54(N) in the phase-based frequency compensation system 38 stores a phase-specific voltage. Thus, voltage from the phase-dependent nulling op-amp 74 is not required to slew the voltage stored in the frequency compensation circuit 54(1)-54(N) upon a transition of the clock phase. This allows the nulling output voltage on the nulling voltage output node 76 to slew from $V_{OUT\text{-}NULL\text{-}P1'}$ to $V_{OUT\text{-}NULL\text{-}P2'}$ in less time as compared to the auto-zeroing op-amp 10 in FIG. 1. In this manner, the nulling voltage output node 76 provides $V_{OUT\text{-}NULL\text{-}P2'}$ to the main op-amp 16 earlier in the second clock phase, thereby reducing erroneous voltages caused by the clock phase transitions on the main voltage output node 20.

Figure 5:
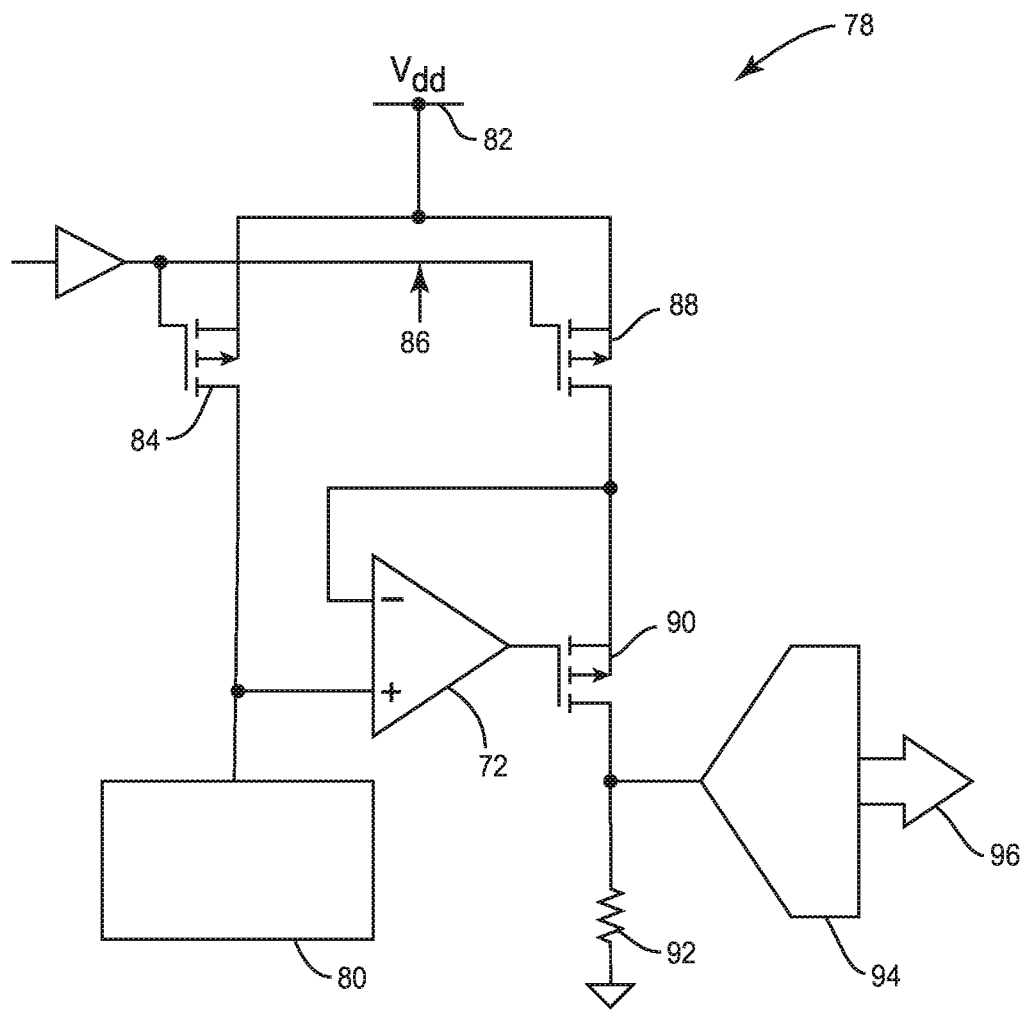
FIG. 5 is a circuit diagram of an exemplary on-die current measurement system that includes the phase-dependent auto-zeroing op-amp in FIG. 4 disposed in different areas of a semiconductor die for measuring on-die currents.

In this regard, FIG. 5 illustrates an on-die current measurement system 78 that yields better performance when employing the phase-dependent auto-zeroing op-amp 72 in FIG. 4. The on-die current measurement system 78 is used to measure a power supply current (not shown) of a load circuit 80. To measure such a current, the on-die current measurement system 78 includes a voltage source ($V_{dd}$) 82 that provides an input voltage to a source of a head switch transistor 84. The head switch transistor 84 provides power control to the load circuit 80 by allowing a voltage signal 86 to reach the load circuit 80. The voltage source 82 also provides an input voltage to a source of a mirror transistor 88, which is a fraction of the width of the head switch transistor 84. Both the head switch transistor 84 and the mirror transistor 88 are biased deep in the field effect transistor (FET) triode region, effectively making them function as low value resistors. Further, a voltage provided by the mirror transistor 88 traverses a cascode transistor 90 into a sense resistor 92. A voltage from the sense resistor 92 is provided to an analog-to-digital converter (ADC) 94, which converts the voltage into a digital data stream 96 that represents the power supply current of the load circuit 80.

With continuing reference to FIG. 5, in order for the on-die current measurement system 78 to function properly, the head switch transistor 84 and the mirror transistor 88 need to have precisely equal drain-source voltages. In this manner, the phase-dependent auto-zeroing op-amp 72 in FIG. 4, together with the cascode transistor 90, forces the drain-source voltage of the mirror transistor 88 to equal that of the head switch transistor 84. More specifically, the phase-dependent auto-zeroing op-amp 72 controls the cascode transistor 90 in order to keep the current on the mirror transistor 88 equal to the current on the head switch transistor 84. In doing so, the drain-source voltages of the mirror transistor 88 and the head switch transistor 84 are kept equal to one another. However, in this example, the head switch transistor 84 is relatively large compared to the mirror transistor 88, and thus, the drain-source voltage of the head switch transistor 84 is relatively small. Thus, any effects of an offset voltage associated with the phase-dependent auto-zeroing op-amp 72 must be small enough so as to be negligible with respect to the drain-source voltage of the head switch transistor 84. If the effects of an offset voltage associated with the phase-dependent auto-zeroing op-amp 72 are negligible, then the phase-dependent auto-zeroing op-amp 72 will not disturb the drain-source voltage of the mirror transistor 88. In this manner, the drain-source voltage of the mirror transistor 88 will be precisely equal to that of the head switch transistor 84 because the phase-dependent auto-zeroing op-amp 72 is configured to negate the effects of its own offset voltages.

Figure 6A:
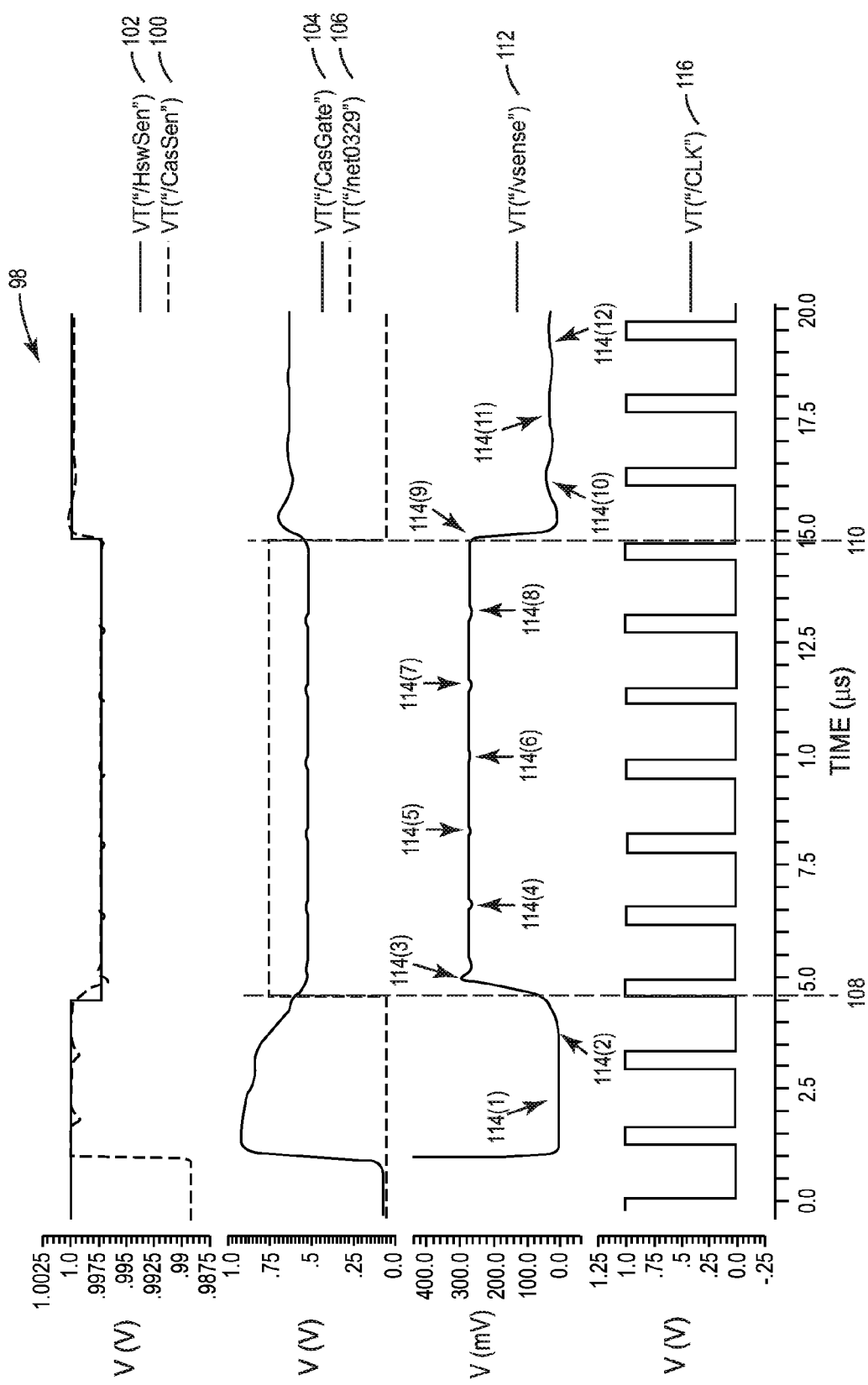
FIG. 6A is a graph illustrating an exemplary set of signals corresponding to the on-die current measurement system in FIG. 5 when using the phase-dependent auto-zeroing op-amp in FIG. 4 that includes the phase-dependent nulling op-amp employing the phase-based frequency compensation system in FIG. 2.

In this regard, FIG. 6A illustrates an exemplary set of signals 98 within the on-die current measurement system 78 in FIG. 5 employing the phase-dependent auto-zeroing op-amp 72 in FIG. 4. As illustrated in FIG. 6A, the drain-source voltage of the mirror transistor 88 (line 100) is forced to equal the drain-source voltage of the head switch transistor 84 (line 102) as a result of the output voltage of the phase-dependent auto-zeroing op-amp 72 (line 104). Further, the power supply voltage of the load circuit 80 (line 106), which is the power supply current of the load circuit 80 multiplied by a resistance, illustrates that the load circuit 80 has an elevated load current from time 108 to time 110. In this manner, the voltage across the sense resistor 92 (line 112) during time 108 to time 110 indicates the measured power supply current of the load circuit 80. Because the phase-dependent auto-zeroing op-amp 72 employs the phase-based frequency compensation system 38 in this aspect, glitches 114(1)-114(12) appearing on the voltage across the sense resistor 92 (line 112) each time a clock signal CLK (line 116) transitions from a first clock phase to a second clock phase have a relatively small amplitude. The small amplitude of the glitches 114(1)-114(12) is a result of the phase-based frequency compensation system 38 increasing the slew rate of the phase-dependent nulling op-amp 74 in the phase-dependent auto-zeroing op-amp 72. In particular, by transitioning more quickly from the voltage associated with the first clock phase to the voltage associated with the second clock phase, the phase-dependent nulling op-amp 74 reduces the effect that offset voltages of the phase-dependent auto-zeroing op-amp 72 have on the drain-source voltage of the mirror transistor 88. In this manner, such effects are also reduced in the remainder of the on-die current measurement system 78.

Figure 6B:
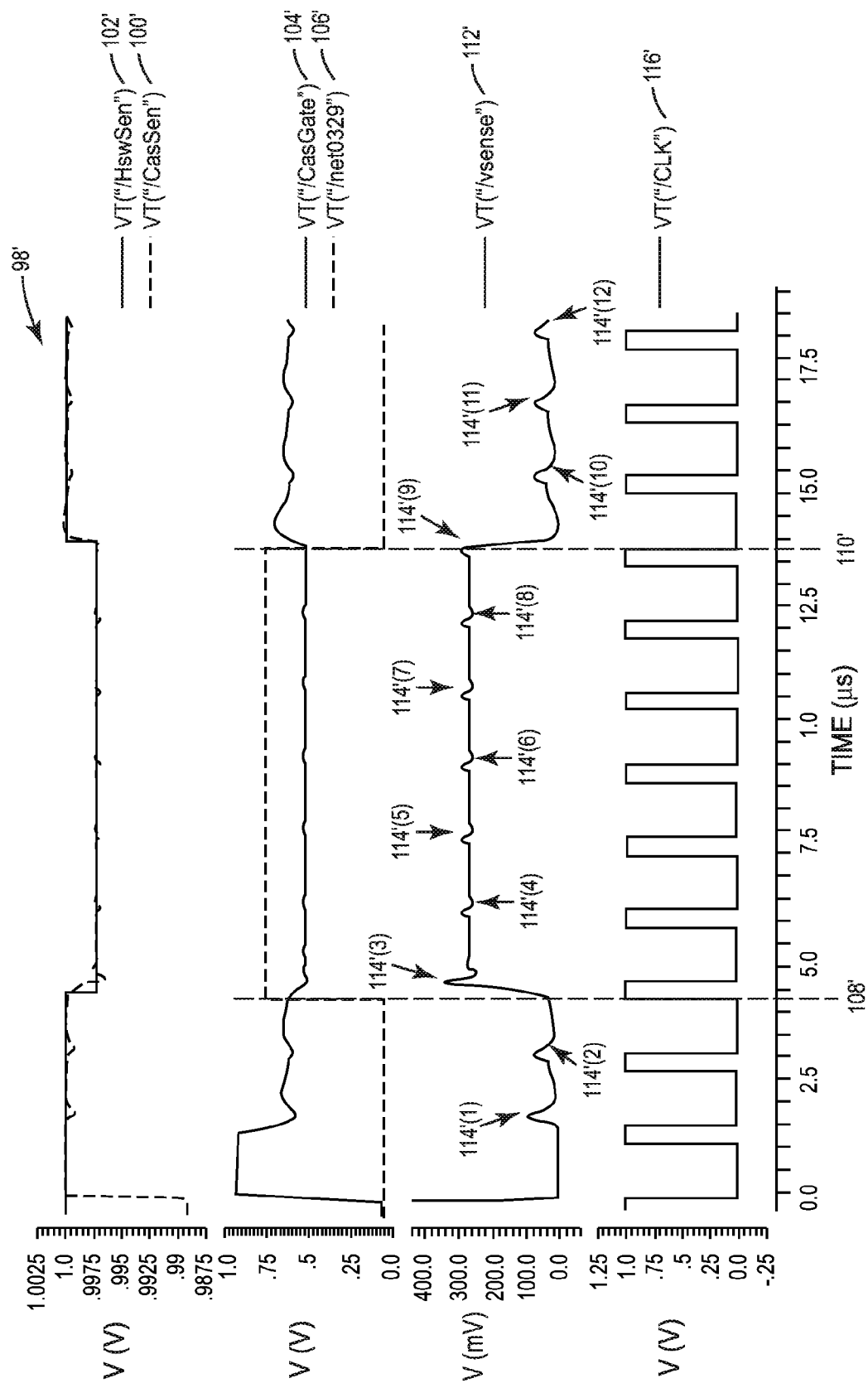
FIG. 6B is a graph illustrating an exemplary set of signals corresponding to the on-die current measurement system in FIG. 5 when using the auto-zeroing op-amp in FIG. 1 that does not employ the phase-based frequency compensation system in FIG. 2.

In contrast, FIG. 6B illustrates an exemplary set of signals 98' within the on-die current measurement system 78 in FIG. 4 when the auto-zeroing op-amp 10 in FIG. 1 is employed. Similar to the details described in FIG. 6A, the drain-source voltage of the mirror transistor 88 (line 100') is forced to equal the drain-source voltage of the head switch transistor 84 (line 102') as a result of the output voltage of the auto-zeroing op-amp 10 in FIG. 1 (line 104'). Further, the power supply voltage of the load circuit 80 (line 106') illustrates that the load circuit 80 has an elevated load current from time 108' to time 110'. In this manner, the voltage across the sense resistor 92 (line 112') during time 108' to time 110' indicates the measured power supply current of the load circuit 80. However, glitches 114'(1)-114'(12) appearing on the voltage across the sense resistor 92 (line 112') each time the clock signal CLK (line 116') transitions from the first clock phase to the second clock phase have a larger amplitude as compared to the glitches 114(1)-114(12) in FIG. 6A. Such an increase in amplitude of the glitches 114'(1)-114'(12) is the result of the slower slew rate of the nulling op-amp 18 in the auto-zeroing op-amp 10 in FIG. 1. More specifically, the output voltage $V_{OUT}$ of the main op-amp 16 within the auto-zeroing op-amp 10 experiences the glitches 114'(1)-114'(12) due to the amount of time required for the nulling op-amp 18 to slew from the voltage associated with the first clock phase to the voltage associated with the second clock phase. Thus, as illustrated by FIG. 6A, employing the phase-dependent auto-zeroing op-amp 72 with the phase-based frequency compensation system 38 in the on-die current measurement system 78 provides an output with reduced glitches 114(1)-114(12) as opposed to employing the auto-zeroing op-amp 10 in FIG. 1.

Figure 7:
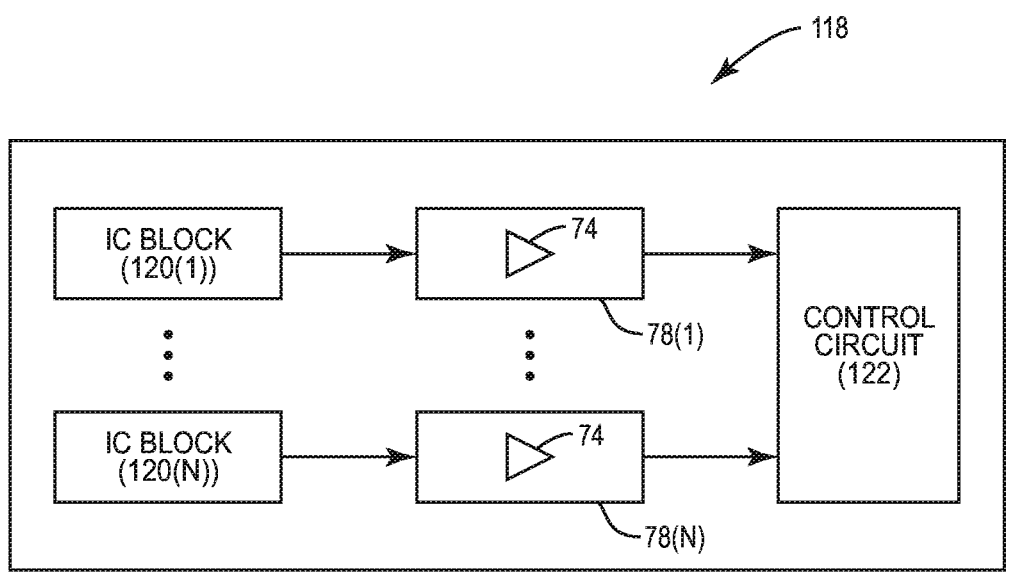
FIG. 7 is a block diagram of an exemplary integrated circuit (IC) that can include a plurality of IC blocks, wherein the on-die current measurement system in FIG. 5 configured to measure a load current is provided to each corresponding IC block.

In this regard, FIG. 7 illustrates an exemplary integrated circuit (IC) 118 that includes a plurality of IC blocks 120(1)-120(N) and a plurality of on-die current measurement systems 78(1)-78(N). In this aspect, each on-die current measurement system 78(1)-78(N) includes the phase-dependent auto-zeroing op-amp 72 (not shown) that employs the phase-dependent nulling op-amp 74 with the phase-based frequency compensation system 38. Thus, as a non-limiting example, each on-die current measurement system 78(1)-78(N) may be configured to measure a load current of each corresponding IC block 120(1)-120(N). After converting the corresponding measured load current to a digital signal as previously described, each on-die current measurement system 78(1)-78(N) may provide the digital signal to a control circuit 122. The control circuit 122 may be configured to use such information from the on-die current measurement systems 78(1)-78(N) for various functions. For example, the control circuit 122 may use such information to calculate and monitor the total load current of the IC 118. If the total load current exceeds a defined threshold, the control circuit 122 may take steps necessary to reduce the load current of one or more of the IC blocks 120(1)-120(N). For example, the control circuit 122 may be configured to throttle a clock signal provided to the IC blocks 120(1)-120(N) so as to reduce the total load current below the defined threshold to prevent overheating of the IC 118. Thus, as evident from this example, a phased-dependent op-amp, such as the phase-dependent op-amp 36 or the phase-dependent auto-zeroing op-amp 72, with the phase-based frequency compensation system 38 may be employed to assist with important functions within a system.

In addition to the aspects previously described herein, a phase-dependent op-amp employing phase-based frequency compensation may achieve similar results using various components. More specifically, with reference to FIG. 8, in this aspect a phase-dependent op-amp 124 employs a phase-based frequency compensation system 126 with a selection circuit comprised of an analog break-before-make multiplexer (MUX) 128. The phase-dependent op-amp 124 includes certain common components with the phase-dependent op-amp 36 in FIG. 2. Such common components are denoted by the same number in FIG. 8 as in FIG. 2, and thus will not be re-described herein.

Figure 8:
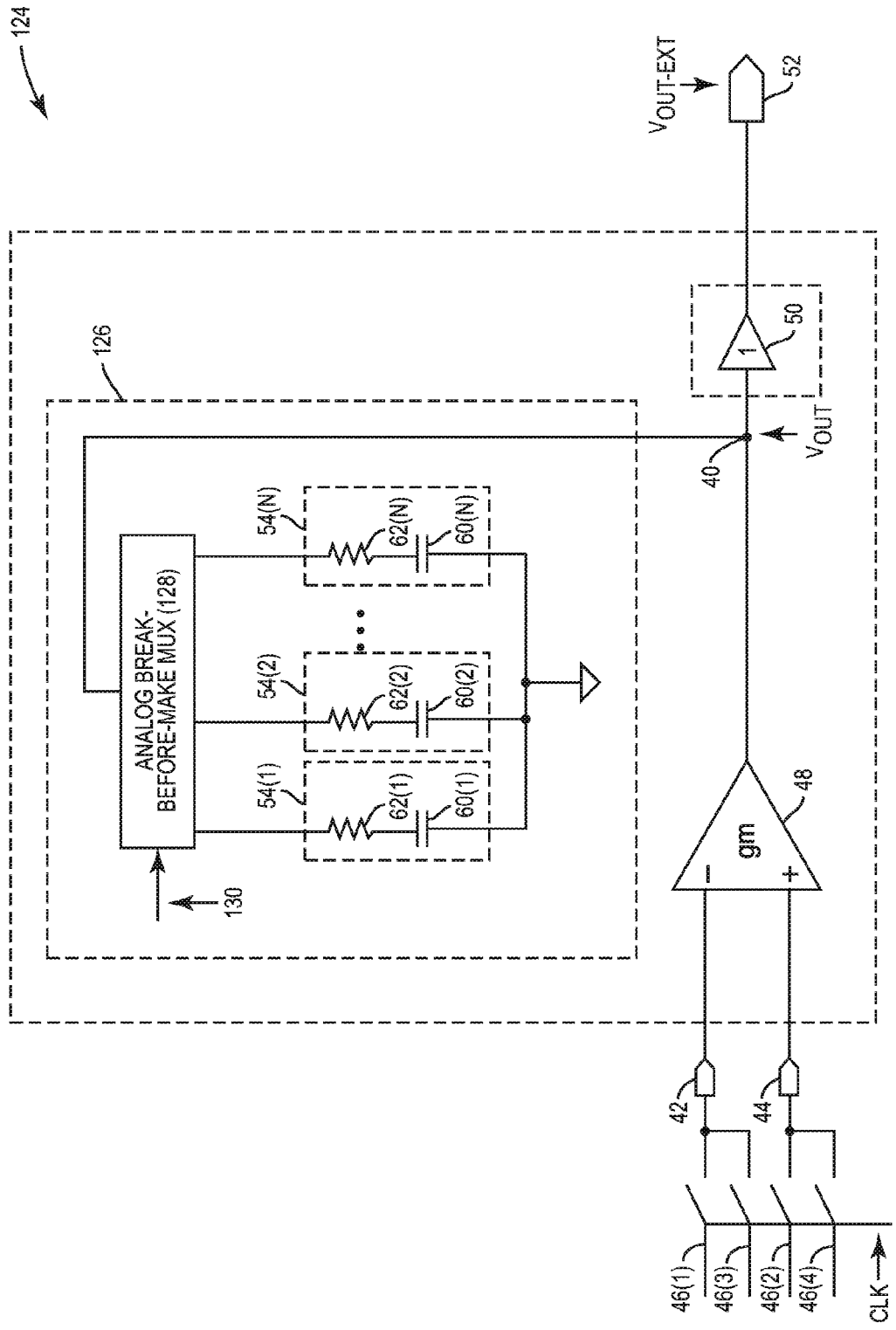
FIG. 8 is a circuit diagram of an exemplary phase-dependent op-amp employing a phase-based frequency compensation system that includes an analog break-before-make multiplexer (MUX) as an exemplary selection circuit for selecting one of the frequency compensation circuits based on a clock phase of a clock signal to increase a slew rate of an output voltage of the phase-dependent op-amp.

In this manner, with continuing reference to FIG. 8, the analog break-before-make MUX 128 provides the phase-dependent op-amp 124 with important voltage control during phase transitions. In particular, the analog break-before-make MUX 128 is configured to completely deselect a previous frequency compensation circuit 54(1)-54(N) before selecting a current frequency compensation circuit 54(1)-54(N) in relation to a change in the clock phase of the clock signal CLK. This prevents the voltages stored on the frequency compensation circuits 54(1)-54(N) from "smearing" during a clock phase transition. In other words, this prevents the voltage stored on one frequency compensation circuit 54(1)-54(N) from transferring to another frequency compensation circuit 54(1)-54(N). For example, upon the clock signal CLK transitioning from the first clock phase to the second clock phase, a multiplexor selector 130 may notify the analog break-before-make MUX 128 of the change to the second clock phase. The analog break-before-make MUX 128 is configured to fully deselect the frequency compensation circuit 54(1). After the frequency compensation circuit 54(1) is deselected, the analog break-before-make MUX 128 is configured to select the frequency compensation circuit 54(2). In this manner, the analog break-before-make MUX 128 ensures that the voltage stored in the frequency compensation circuit 54(1) is not transferred into the frequency compensation circuit 54(2), and vice versa. This allows the voltages stored within each frequency compensation circuit 54(1)-54(N) to remain at the desired level for the corresponding clock phase even during clock phase changes. Thus, the analog break-before-make MUX 128 may be implemented to prevent voltage smearing in the phase-based frequency compensation system 126, helping the phase-dependent op-amp 124 to provide frequency compensation while increasing the slew rate of the output voltage $V_{OUT}$ on the voltage output node 40.

With reference back to FIG. 2, the phase-based frequency compensation system 38 is configured to provide "simple" frequency compensation. In this manner, with continuing reference to FIG. 2, the voltage output node 40 is coupled to an input of the unity gain amplifier 50 and the phase-based frequency compensation system 38 in this example. As previously noted, other aspects may provide similar functionality by employing circuit elements in place of the unity gain amplifier 50, such as a wire. The phase-based frequency compensation system 38 is configured to provide the voltage output node 40 to a first input 132(1)-132(N) of the frequency compensation circuit 54(1)-54(N) selected by the selection circuit 56. Further, a second input 134(1)-134(N) of each frequency compensation circuit 54(1)-54(N) is coupled to a ground source 136. In this manner, the phase-based frequency compensation system 38 is configured to provide "simple" frequency compensation to the phase-dependent op-amp 36.

In addition to configuring the phase-based frequency compensation system 38 to provide "simple" frequency compensation as illustrated in the aspect in FIG. 2, other aspects may achieve additional types of compensation. In this regard, with reference to FIG. 9A and FIG. 9B, the phase-based frequency compensation system 38 may be configured within phase-dependent op-amps 138, 138' to achieve Miller frequency compensation. The phase-dependent op-amps 138, 138' include certain common components with the phase-dependent op-amp 36 in FIG. 2. Such common components are denoted by the same number in FIG. 9A and FIG. 9B as in FIG. 2, and thus will not be re-described herein.

Figure 9A:
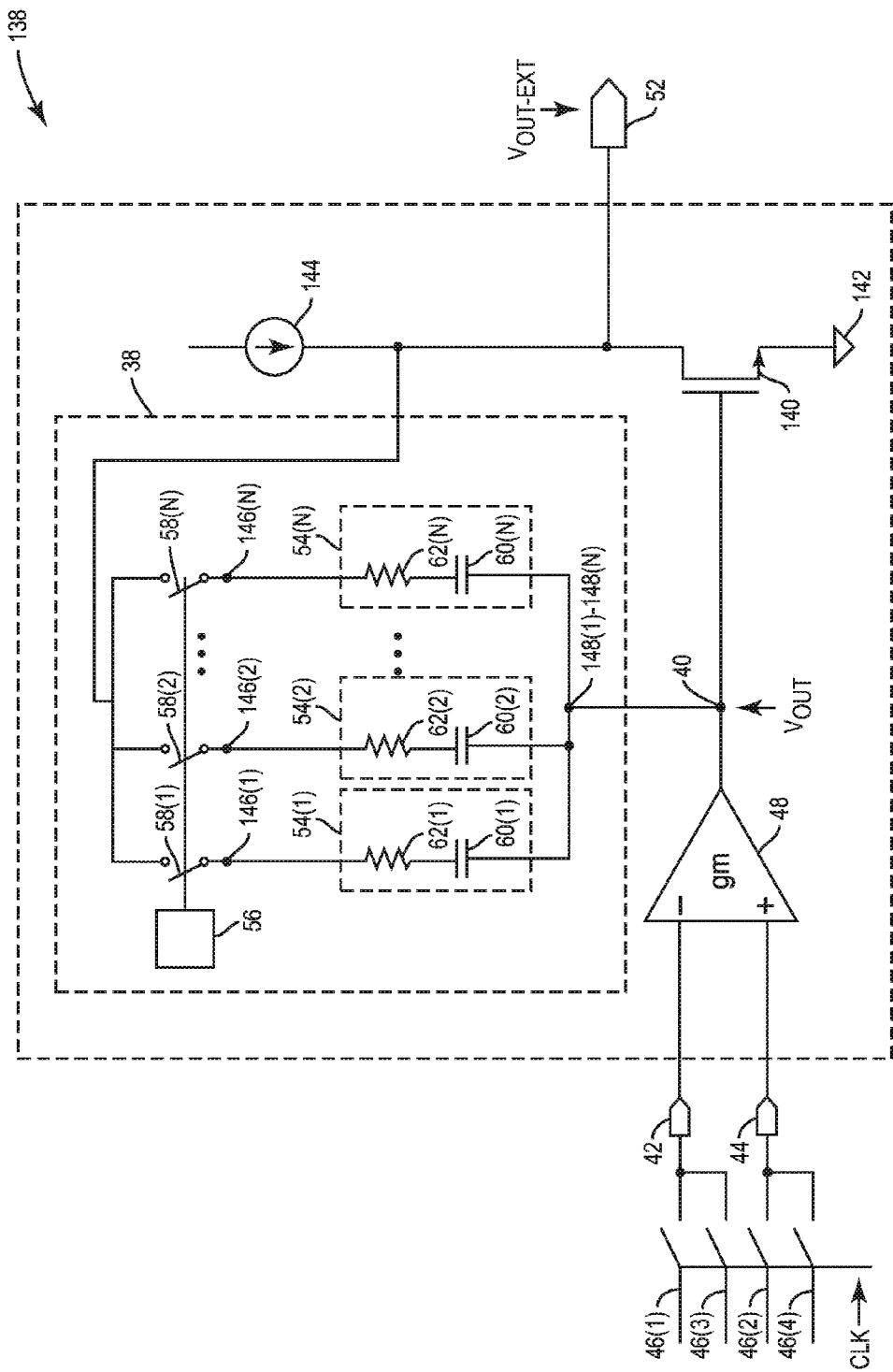
FIG. 9A is a circuit diagram of an exemplary phase-dependent op-amp employing a phase-based frequency compensation system that provides Miller compensation using an n-type metal oxide semiconductor (NMOS) transistor by employing a plurality of frequency compensation circuits, and a selection circuit configured to select one of the frequency compensation circuits based on a clock phase of a clock signal to increase a slew rate of an output voltage of the phase-dependent op-amp.

In this manner, with particular reference to FIG. 9A, the differential amplifier 48 within the phase-dependent op-amp 138 generates the output voltage $V_{OUT}$ on the voltage output node 40. The voltage output node 40 is coupled to a gate of an n-type metal oxide semiconductor (NMOS) transistor 140. A source of the NMOS transistor 140 is coupled to a ground source 142, while a drain of the NMOS transistor 140 is coupled to a current source 144, the external voltage output node 52, and the phase-based frequency compensation system 38. The external voltage output node 52 is coupled to a first input 146(1)-146(N) of the frequency compensation circuit 54(1)-54(N) selected by the selection circuit 56. In this manner, the NMOS transistor 140 and the current source 144 function as an inverting gain stage needed to achieve the Miller effect within Miller frequency compensation. Further, a second input 148(1)-148(N) of each frequency compensation circuit 54(1)-54(N) is coupled to the voltage output node 40. In this manner, the phase-based frequency compensation system 38 is configured to provide Miller frequency compensation to the phase-dependent op-amp 138.

Figure 9B:
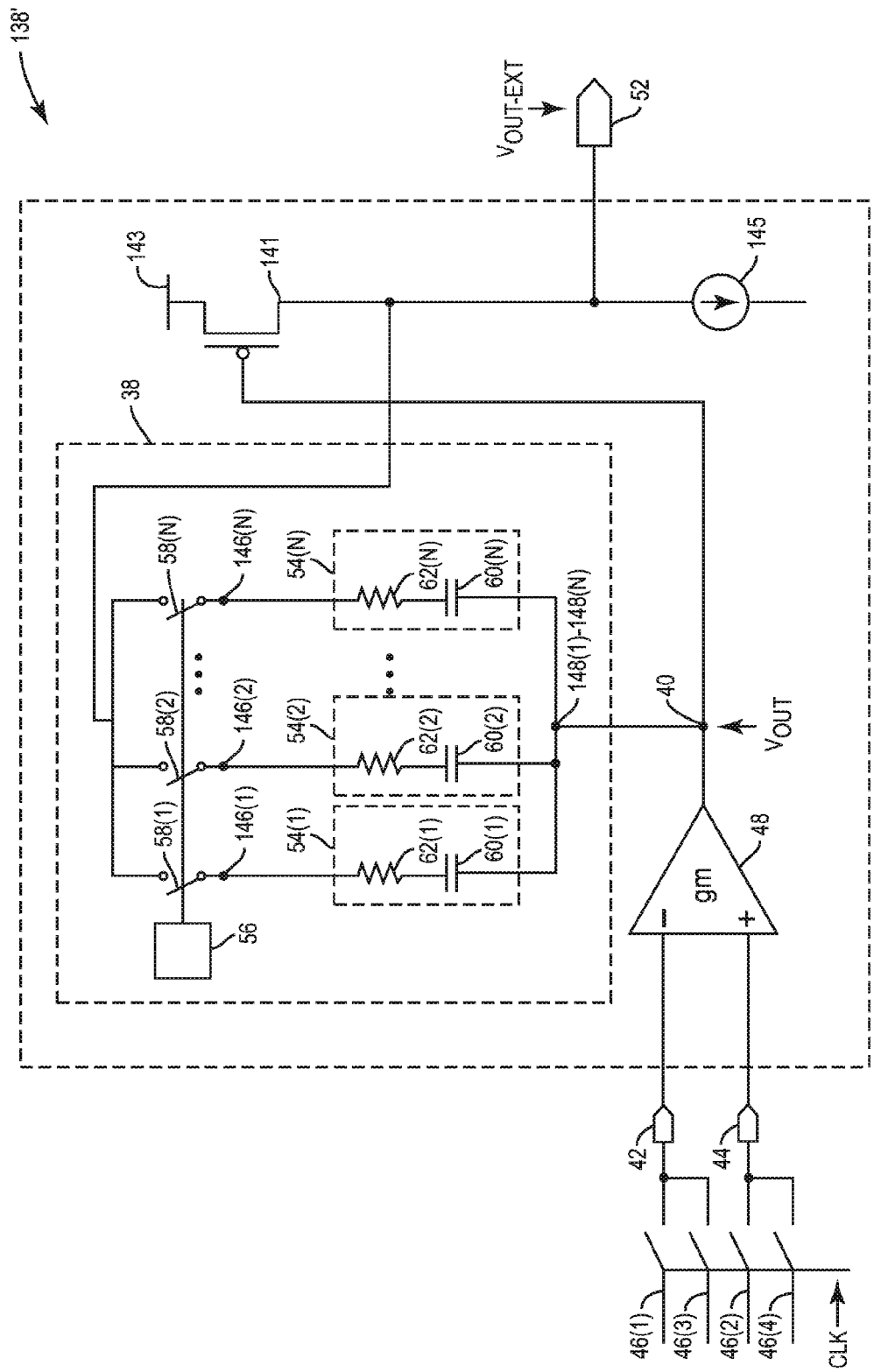
FIG. 9B is a circuit diagram of an exemplary phase-dependent op-amp employing a phase-based frequency compensation system that provides Miller compensation using a p-type metal oxide semiconductor (PMOS) transistor by employing a plurality of frequency compensation circuits, and a selection circuit configured to select one of the frequency compensation circuits based on a clock phase of a clock signal to increase a slew rate of an output voltage of the phase-dependent op-amp.

Further, with particular reference to FIG. 9B, the differential amplifier 48 within the phase-dependent op-amp 138' generates the output voltage $V_{OUT}$ on the voltage output node 40. The voltage output node 40 is coupled to a gate of a p-type metal oxide semiconductor (PMOS) transistor 141. A source of the PMOS transistor 141 is coupled to a voltage source 143, while a drain of the PMOS transistor 141 is coupled to a current source 145, the external voltage output node 52, and the phase-based frequency compensation system 38. The external voltage output node 52 is coupled to a first input 146(1)-146(N) of the frequency compensation circuit 54(1)-54(N) selected by the selection circuit 56. In this manner, the PMOS transistor 141 and the current source 145 function as an inverting gain stage needed to achieve the Miller effect within Miller frequency compensation. Further, a second input 148(1)-148(N) of each frequency compensation circuit 54(1)-54(N) is coupled to the voltage output node 40. In this manner, the phase-based frequency compensation system 38 is configured to provide Miller frequency compensation to the phase-dependent op-amp 138'.

The phase-dependent op-amps with phase-based frequency compensation systems according to aspects disclosed herein may be provided in or integrated into any electronic device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
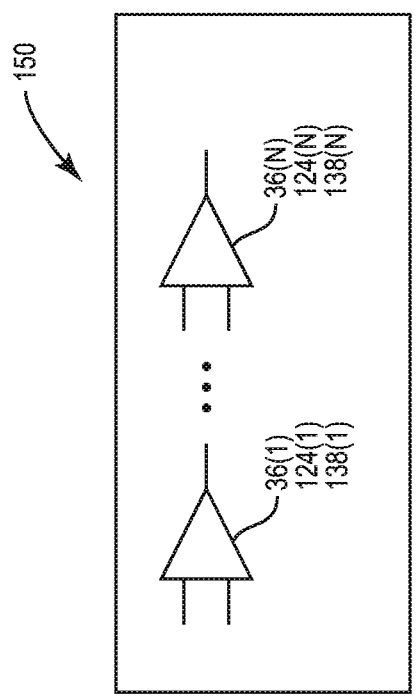
FIG. 10 is a circuit diagram of a switched-capacitor network employing a plurality of phase-dependent op-amps that can employ a phase-based frequency compensation system including, without limitation, the phase-based frequency compensation systems in FIGS. 2 and 9.

In this regard, FIG. 10 illustrates an example of an electronic device 150 that can employ phase-dependent op-amps employing the phase-based frequency compensation systems 38, 126 illustrated in FIGS. 2, 8, and 9. In this example, a plurality of the phase-dependent op-amps 36(1)-36(N), 124(1)-124(N), 138(1)-138(N), or any combination thereof, may be employed within the electronic device 150 that includes a switched-capacitor network (not shown). In this manner, the phase-dependent op-amps 36(1)-36(N), 124(1)-124(N), 138(1)-138(N) may assist with various functions within the electronic device 150 that involve multiple phases. In particular, by providing frequency compensation while increasing the slew rate between phase-specific voltages, the phase-dependent op-amps 36(1)-36(N), 124(1)-124(N), 138(1)-138(N) may improve performance and accuracy of various functions within the electronic device 150.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A phase-dependent operational amplifier, comprising:
    a differential amplifier comprising a first differential pair of inputs switched in response to a clock signal, the differential amplifier configured to generate an output voltage on a voltage output node based on a differential of the first differential pair of inputs; and
    a phase-based frequency compensation system coupled to the voltage output node, the phase-based frequency compensation system comprising:
        a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the output voltage; and
        a selection circuit configured to select a frequency compensation circuit among the plurality of frequency compensation circuits based on the corresponding clock phase of the clock signal.

2. The phase-dependent operational amplifier of claim 1, wherein each frequency compensation circuit of the plurality of frequency compensation circuits comprises a resistor-capacitor (RC) circuit.

3. The phase-dependent operational amplifier of claim 2, wherein each RC circuit comprises at least one resistor connected in series with at least one capacitor.

4. The phase-dependent operational amplifier of claim 1, wherein the selection circuit is further configured to select the frequency compensation circuit among the plurality of frequency compensation circuits based on the corresponding clock phase of the clock signal by activating one switch of a plurality of switches corresponding to the frequency compensation circuit.

5. The phase-dependent operational amplifier of claim 1, wherein the selection circuit comprises a multiplexer configured to select the frequency compensation circuit among the plurality of frequency compensation circuits based on a multiplexer selector corresponding to the corresponding clock phase of the clock signal.

6. The phase-dependent operational amplifier of claim 5, wherein the multiplexer comprises an analog break-before-make multiplexer configured to deselect a previous frequency compensation circuit among the plurality of frequency compensation circuits for a previous clock phase of the clock signal, before selecting a current frequency compensation circuit among the plurality of frequency compensation circuits of a current clock phase of the clock signal.

7. The phase-dependent operational amplifier of claim 1, further comprising:
the differential amplifier further configured to provide the output voltage to an external voltage output node; and
the phase-based frequency compensation system configured to:
receive the output voltage generated on the voltage output node; and
provide the output voltage generated on the voltage output node to a first input of the frequency compensation circuit selected by the selection circuit, wherein a second input of each of the plurality of frequency compensation circuits is coupled to a ground source.

8. The phase-dependent operational amplifier of claim 1, further comprising:
an n-type metal oxide semiconductor (NMOS) transistor, comprising:
a gate coupled to the voltage output node;
a source coupled to a ground source;
a drain coupled to an external voltage output node, a current source, and the phase-based frequency compensation system; and
the phase-based frequency compensation system configured to:
receive an external output voltage generated on the external voltage output node; and
provide the external output voltage generated on the external voltage output node to a first input of the frequency compensation circuit selected by the selection circuit, wherein a second input of each of the plurality of frequency compensation circuits is coupled to the voltage output node.

9. The phase-dependent operational amplifier of claim 1, further comprising:
a p-type metal oxide semiconductor (PMOS) transistor, comprising:
a gate coupled to the voltage output node;
a source coupled to a voltage source;
a drain coupled to an external voltage output node, a current source, and the phase-based frequency compensation system; and
the phase-based frequency compensation system configured to:
receive an external output voltage generated on the external voltage output node; and
provide the external output voltage generated on the external voltage output node to a first input of the frequency compensation circuit selected by the selection circuit, wherein a second input of each of the plurality of frequency compensation circuits is coupled to the voltage output node.

10. The phase-dependent operational amplifier of claim 1 integrated into an integrated circuit (IC).

11. The phase-dependent operational amplifier of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

12. A phase-dependent operational amplification means, comprising:
a means for generating an output voltage based on a differential of a first differential pair of inputs; and
a means for phase-based frequency compensating the output voltage, comprising:
a plurality of frequency compensation means for compensating the output voltage, each corresponding to a different corresponding clock phase of a clock signal, each frequency compensation means among the plurality of frequency compensation means configured to store a phase-specific compensation voltage corresponding to the corresponding clock phase of the clock signal to increase a slew rate of the output voltage; and
a means for selecting one of the plurality of frequency compensation means of compensating the output voltage based on the corresponding clock phase of the clock signal.

13. A phase-dependent auto-zeroing operational amplifier, comprising:
a main operational amplifier comprising:
a first main differential pair of inputs configured to receive a first voltage and a second voltage; and
a second main differential pair of inputs configured to:
receive a reference voltage and a main correction voltage during a first clock phase of a clock signal; and
receive a reference voltage and a nulling output voltage generated on a nulling voltage output node during a second clock phase of the clock signal;
the main operational amplifier configured to generate an output voltage on a main voltage output node based on a differential of the first main differential pair of inputs and a differential of the second main differential pair of inputs; and
a phase-dependent nulling operational amplifier, comprising:
a differential amplifier, comprising:
a first nulling differential pair of inputs configured to:
receive the first voltage during the first clock phase of the clock signal; and
receive the first voltage and the second voltage during the second clock phase of the clock signal;
a second nulling differential pair of inputs configured to:
receive the reference voltage and the nulling output voltage generated on the nulling voltage output node during the first clock phase of the clock signal; and
receive the reference voltage and a nulling correction voltage during the second clock phase of the clock signal;
the differential amplifier configured to generate an output voltage based on a differential of the first nulling differential pair of inputs and a differential of the second nulling differential pair of inputs; and
the phase-dependent nulling operational amplifier configured to generate the nulling output voltage on the nulling voltage output node based on the output voltage of the differential amplifier;

a phase-based frequency compensation system coupled to the nulling voltage output node of the phase-dependent nulling operational amplifier, the phase-based frequency compensation system comprising:
  a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the nulling output voltage on the nulling voltage output node; and
  a selection circuit configured to select a frequency compensation circuit among the plurality of frequency compensation circuits based on the corresponding clock phase of the clock signal.

14. The phase-dependent auto-zeroing operational amplifier of claim 13, wherein the phase-dependent nulling operational amplifier further comprises:
  the phase-based frequency compensation system configured to:
    receive the nulling output voltage generated on the nulling voltage output node; and
    provide the nulling output voltage generated on the nulling voltage output node to a first input of the frequency compensation circuit selected by the selection circuit, wherein a second input of each of the plurality of frequency compensation circuits is connected to a ground source.

15. The phase-dependent auto-zeroing operational amplifier of claim 13, wherein the phase-dependent nulling operational amplifier further comprises:
  an n-type metal oxide semiconductor (NMOS) transistor comprising:
    a gate coupled to an output of the differential amplifier;
    a source coupled to a ground source; and
    a drain coupled to the nulling voltage output node, a current source, and the phase-based frequency compensation system;
  the phase-based frequency compensation system configured to:
    receive the nulling output voltage generated on the nulling voltage output node; and
    provide the nulling output voltage to a first input of the frequency compensation circuit selected by the selection circuit, wherein a second input of each of the plurality of frequency compensation circuits is connected to the output of the differential amplifier.

16. The phase-dependent auto-zeroing operational amplifier of claim 13, wherein the phase-dependent nulling operational amplifier further comprises:
  a p-type metal oxide semiconductor (PMOS) transistor comprising:
    a gate coupled to an output of the differential amplifier;
    a source coupled to a voltage source; and
    a drain coupled to the nulling voltage output node, a current source, and the phase-based frequency compensation system;
  the phase-based frequency compensation system configured to:
    receive the nulling output voltage generated on the nulling voltage output node; and
    provide the nulling output voltage to a first input of the frequency compensation circuit selected by the selection circuit, wherein a second input of each of the plurality of frequency compensation circuits is connected to the output of the differential amplifier.

17. The phase-dependent auto-zeroing operational amplifier of claim 13, wherein each frequency compensation circuit of the plurality of frequency compensation circuits comprises a resistor-capacitor (RC) circuit.

18. The phase-dependent auto-zeroing operational amplifier of claim 13, wherein the selection circuit comprises a multiplexer configured to select the frequency compensation circuit among the plurality of frequency compensation circuits based on a multiplexer selector corresponding to the corresponding clock phase of the clock signal.

19. The phase-dependent auto-zeroing operational amplifier of claim 18, wherein the multiplexer comprises a break-before-make multiplexer configured to deselect a previous frequency compensation circuit among the plurality of frequency compensation circuits for a previous clock phase of the clock signal, before selecting a current frequency compensation circuit among the plurality of frequency compensation circuits of a current clock phase of the clock signal.

20. The phase-dependent auto-zeroing operational amplifier of claim 13 integrated into an integrated circuit (IC).

21. The phase-dependent auto-zeroing operational amplifier of claim 13 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

22. An on-die current measurement system, comprising:
  a voltage source configured to:
    provide voltage to a source of a head switch transistor; and
    provide voltage to a source of a mirror transistor;
  the head switch transistor configured to provide voltage to a load circuit;
  the mirror transistor configured to provide voltage to a source of a cascode transistor;
  a drain of the cascode transistor configured to provide voltage to a sense resistor;
  the sense resistor configured to provide a voltage to an analog-to-digital converter (ADC);
  the ADC configured to convert the voltage from the sense resistor into a digital signal representative of a power supply current of the load circuit; and
  a phase-dependent auto-zeroing operational amplifier configured to receive a first voltage from a drain of the mirror transistor and a second voltage from the load circuit, comprising:
    a main operational amplifier comprising:
      a first main differential pair of inputs configured to receive a first voltage and a second voltage; and
      a second main differential pair of inputs configured to:
        receive a reference voltage and a main correction voltage during a first clock phase of a clock signal; and
        receive a reference voltage and a nulling output voltage generated on a nulling voltage output node during a second clock phase of the clock signal;
      the main operational amplifier configured to generate an output voltage on a main voltage output node based on a differential of the first main differential pair of inputs and a differential of the second main differential pair of inputs; and a phase-dependent nulling operational amplifier, comprising:
a differential amplifier, comprising:
a first nulling differential pair of inputs configured to:
receive the first voltage during the first clock phase of the clock signal; and
receive the first voltage and the second voltage during the second clock phase of the clock signal;
a second nulling differential pair of inputs configured to:
receive the reference voltage and the nulling output voltage generated on the nulling voltage output node during the first clock phase of the clock signal; and
receive the reference voltage and a nulling correction voltage during the second clock phase of the clock signal;
the differential amplifier configured to generate an output voltage based on a differential of the first nulling differential pair of inputs and a differential of the second nulling differential pair of inputs; and
the phase-dependent nulling operational amplifier configured to generate the nulling output voltage on the nulling voltage output node based on the output voltage of the differential amplifier;
a phase-based frequency compensation system coupled to the nulling voltage output node of the phase-dependent nulling operational amplifier, the phase-based frequency compensation system comprising:
a plurality of frequency compensation circuits each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the nulling output voltage on the nulling voltage output node; and
a selection circuit configured to select a frequency compensation circuit among the plurality of frequency compensation circuits based on the corresponding clock phase of the clock signal; and
the phase-dependent auto-zeroing operational amplifier further configured to provide the output voltage generated on the main voltage output node to a gate of the cascode transistor.

23. The on-die current measurement system of claim 22, wherein each frequency compensation circuit of the plurality of frequency compensation circuits comprises a resistor-capacitor (RC) circuit.

24. The on-die current measurement system of claim 22, wherein the phase-dependent nulling operational amplifier further comprises:
the phase-based frequency compensation system configured to:
receive the nulling output voltage generated on the nulling voltage output node; and
provide the nulling output voltage generated on the nulling voltage output node to a first input of the frequency compensation circuit selected by the selection circuit, wherein a second input of each of the plurality of frequency compensation circuits is connected to a ground source.

25. The on-die current measurement system of claim 22, wherein the phase-dependent nulling operational amplifier further comprises:
an n-type metal oxide semiconductor (NMOS) transistor comprising:
a gate coupled to an output of the differential amplifier;
a drain coupled to a ground source; and
a source coupled to the nulling voltage output node, a current source, and the phase-based frequency compensation system;
the phase-based frequency compensation system configured to:
receive the nulling output voltage generated on the nulling voltage output node; and
provide the nulling output voltage to a first input of the frequency compensation circuit selected by the selection circuit, wherein a second input of each of the plurality of frequency compensation circuits is connected to the output of the differential amplifier.

26. The on-die current measurement system of claim 22, wherein the phase-dependent nulling operational amplifier further comprises:
a p-type metal oxide semiconductor (PMOS) transistor comprising:
a gate coupled to an output of the differential amplifier;
a source coupled to a voltage source; and
a drain coupled to the nulling voltage output node, a current source, and the phase-based frequency compensation system;
the phase-based frequency compensation system configured to:
receive the nulling output voltage generated on the nulling voltage output node; and
provide the nulling output voltage to a first input of the frequency compensation circuit selected by the selection circuit, wherein a second input of each of the plurality of frequency compensation circuits is connected to the output of the differential amplifier.

27. The on-die current measurement system of claim 22 integrated into an integrated circuit (IC).

28. The on-die current measurement system of claim 22 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

29. A method of phase-dependent operational amplification, comprising:
generating an output voltage on a voltage output node based on a differential of a first differential pair of inputs;
selecting one of a plurality of frequency compensation circuits based on a clock phase of a clock signal; and
compensating the output voltage using one of the plurality of frequency compensation circuits, each corresponding to a different corresponding clock phase of the clock signal, each frequency compensation circuit among the plurality of frequency compensation circuits configured to store a phase-specific compensation voltage corresponding to the corresponding clock phase of the clock signal to increase a slew rate of the output voltage.

* * * * *